(12) United States Patent
Chen (10) Patent No.: US 9,713,276 B2
(45) Date of Patent: Jul. 18, 2017

(54) REMOVAL DEVICE (71) Applicant: Huawei Technologies Co., Ltd., Shenzhen, Guangdong (CN)

(72) Inventor: Jie Chen, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 381 days.

(21) Appl. No.: 14/548,050

(22) Filed: Nov. 19, 2014

(65) Prior Publication Data

US 2015/0074992 A1  Mar. 19, 2015

Related U.S. Application Data

(63) Continuation of application No. PCT/CN2013/072059, filed on Mar. 1, 2013.

(30) Foreign Application Priority Data

Jun. 13, 2012 (CN) .......................... 2012 1 0194370

(51) Int. Cl.
   *B23P 19/00* (2006.01)
   *H05K 7/14* (2006.01)
(52) U.S. Cl.
   CPC ...... *H05K 7/1409* (2013.01); *Y10T 29/53283* (2015.01)
(58) Field of Classification Search
   CPC ... H05K 7/1409; H05K 7/14; Y10T 29/53283

USPC .......................................... 29/764, 762, 700
See application file for complete search history.

(56) References Cited

U.S. PATENT DOCUMENTS

| 4,377,906 A | * | 3/1983 | Bertellotti ............ H05K 7/1415 29/267 |
| 6,381,146 B1 | | 4/2002 | Sevier |

FOREIGN PATENT DOCUMENTS

| CN | 201201208 Y | 3/2009 |
| CN | 102820603 A | 12/2012 |
| EP | 0 917 416 A1 | 5/1999 |
| JP | 2012104767 A | 5/2012 |

* cited by examiner

*Primary Examiner* — Peter DungBa Vo
*Assistant Examiner* — Azm Parvez (57) ABSTRACT

A removal device includes a wrench part, a handle part, and a thrust control apparatus. The wrench part and the handle part are in a split structure. The wrench part is rotatably connected to a daughter-board panel, and the wrench part is rotatably connected to the handle part. The wrench part includes a bayonet end and a wrench connecting end. A bayonet is provided on the bayonet end, and the bayonet is clamped on the subrack. The handle part includes a handle connecting end and a handle end. A thrust control apparatus is disposed at a junction between the wrench connecting end and the handle connecting end. The thrust control apparatus is configured to restrict motion of the handle part relative to the wrench part, and control maximum thrust when force is applied to the handle end.

12 Claims, 8 Drawing Sheets

FIG. 7b

REMOVAL DEVICE

CROSS-REFERENCE TO RELATED APPLICATIONS

This application is a continuation of International Application No. PCT/CN2013/072059, filed on Mar. 1, 2013, which claims priority to Chinese Patent Application No. 201210194370.4, filed on Jun. 13, 2012, both of which are hereby incorporated by reference in their entireties.

TECHNICAL FIELD

The present invention relates to the field of communications devices, and in particular, to a removal device.

BACKGROUND

A backplane connector (backplane connector) is a type of connector that is commonly used in a large communications device, a super-high performance server, a giant computer, an industrial computer, and a high-end storage device, and a main function of the backplane connector is to connect a daughter board (daughter board) and a backplane.

Figure 1A:
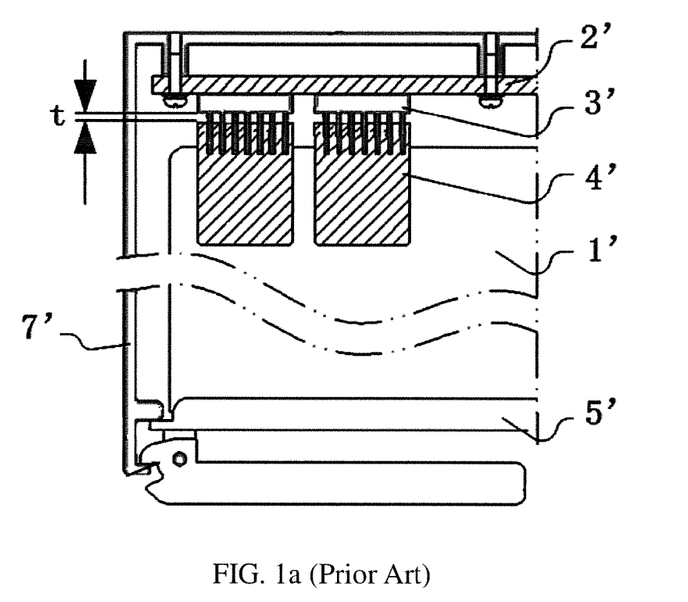
FIG. 1a is an assembly view when a fitting distance t exists between a daughter board and a backplane in the prior art.

As shown in FIG. 1a, a daughter board 1' and a backplane 2' in a communications device need to be connected together. Specifically, a daughter board connector 4' disposed on the daughter board 1' needs to be inserted into a backplane connector 3' disposed on the backplane 2', so as to connect the daughter board 1' and the backplane 2'. However, if a fitting distance t between the daughter board connector 4' and the backplane connector 3' is too large, stability of a high-speed signal is affected.

Figure 1B:
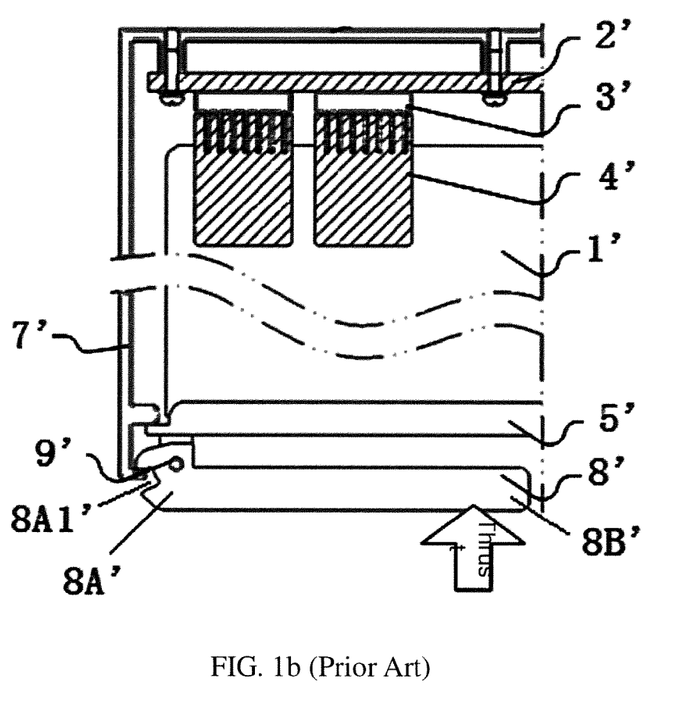
FIG. 1b is an assembly view when a daughter board and a backplane are completely fit in the prior art.

As shown in FIG. 1b, at present, a removal device 8' is used to implement installation of the daughter board connector 4' and the backplane connector 3'. The removal device is in a wrench shape on the whole. The removal device includes a wrench part 8A' and a handle part 8B'. A bayonet 8A1' is disposed on the wrench part 8A'. The bayonet 8A1' is clamped on a subrack 7'. The wrench part 8A' is connected to a daughter-board panel 5' by using a rotation shaft 9, so that the removal device can rotate around the rotation shaft 9. When an operator pushes the handle, thrust is increased by the removal device and is conveyed to the daughter board 1' by using the daughter-board panel 5', and then the daughter board 1' is inserted into the subrack 7', and meanwhile the daughter board connector 4' is inserted into the backplane connector 3'.

As shown in FIG. 1b, the removal device 8' that uses the foregoing structure increases the thrust, and installation is easy, but sensory information cannot be fed back to the operator and maximum thrust cannot be controlled when the thrust is too large. Therefore, the operator is likely to continue to increase the thrust, thereby resulting in serious deformation or damage of the daughter board 1' and the backplane 2', that is, over-thrust cannot be avoided.

SUMMARY

Embodiments of the present invention provide a removal device to solve a problem that by using a removal device in the prior art, sensory information cannot be fed back to an operator and cannot control maximum thrust either when thrust is too large, so that the operator is likely to continue to increase the thrust, thereby resulting in serious deformation or damage of a daughter board and a backplane. The technical solutions are as follows:

a removal device, disposed in a subrack, configured to assist in installation of a daughter board, and including a wrench part, a handle part, and a thrust control apparatus, where the wrench part and the handle part are in a split structure, the wrench part is rotatably connected to a daughter-board panel, so that the wrench part can rotate relative to the daughter-board panel, and the wrench part is rotatably connected to the handle part, so that the handle part can rotate relative to the wrench part; and the wrench part includes a bayonet end and a wrench connecting end, where a bayonet is provided on the bayonet end, the bayonet is clamped on the subrack; the handle part includes a handle connecting end and a handle end, and the handle end is configured to apply force; and the thrust control apparatus is disposed at a junction of the wrench connecting end and the handle connecting end, and the thrust control apparatus is configured to restrict motion of the handle part relative to the wrench part, and control maximum thrust when force is applied to the handle end.

Specifically, a groove is provided on the wrench connecting end, the groove is configured to accommodate the handle connecting end, a blind via is provided on the handle connecting end, and the blind via is configured to accommodate the thrust control apparatus.

Specifically, the thrust control apparatus includes a sliding part and an elastic part. The sliding part and the elastic part are installed in the blind via in an outside-to-inside sequence. In an initial state, motion of the sliding part is restricted under an action of counter-acting force of the elastic part, so as to restrict the handle part to generating motion relative to the wrench part; and in a use state, by means of applying force on the handle, the handle is driven to rotate, so that the sliding part pushes the elastic part to enable the elastic part in a compressed state, thereby enable the sliding part to detach from the groove, so as to control the maximum thrust.

Specifically, the sliding part is a sliding block; the wrench part and the daughter-board panel are rotatably connected by using a first rotation shaft; the wrench part and the handle part are rotatably connected by using a second rotation shaft; and in the initial state, the sliding block abuts against a groove bottom of the groove.

Specifically, the sliding part is a bead; the wrench part and the daughter-board panel are rotatably connected by using a first rotation shaft; the wrench part and the handle part are rotatably connected by using a second rotation shaft; and in the initial state, the bead abuts against a groove bottom of the groove; and a concave surface that matches the bead is provided on the groove bottom of the groove.

Specifically, the sliding part is a sliding block; a key is arranged on one end of the sliding block; the wrench part and the daughter-board panel are rotatably connected by using a first rotation shaft; the wrench part and the handle part are rotatably connected by using a second rotation shaft; a key groove is provided on the second rotation shaft; the key groove and the key are matched; and in the initial state, the key of the sliding block abuts against the key groove of the second rotation shaft.

Specifically, a blind via is provided on the wrench connecting end, the blind via is configured to accommodate the thrust control apparatus, a groove is provided on the handle connecting end, and the groove is configured to accommodate the handle connecting end.

Specifically, the thrust control apparatus includes a sliding part and an elastic part. The sliding part and the elastic part are installed in the blind via in an outside-to-inside sequence. In an initial state, motion of the sliding part is restricted under an action of counter-acting force of the elastic part, so as to restrict the handle part to generating motion relative to the wrench part; and in a use state, by means of applying force on the handle, the handle is driven to rotate, so that the sliding part pushes the elastic part to enable the elastic part in a compressed state, thereby enable the sliding part to detach from the groove, so as to control the maximum thrust.

Specifically, the sliding part is a sliding block; the wrench part and the daughter-board panel are rotatably connected by using a first rotation shaft; the wrench part and the handle part are rotatably connected by using a second rotation shaft; and in the initial state, the sliding block abuts against a groove bottom of the groove.

Specifically, the sliding part is a bead; the wrench part and the daughter-board panel are rotatably connected by using a first rotation shaft; the wrench part and the handle part are rotatably connected by using a second rotation shaft; and in the initial state, the bead abuts against a groove bottom of the groove; and a concave surface that matches the bead is provided on the groove bottom of the groove.

Specifically, the sliding part is a sliding block; a key is arranged on one end of the sliding block; the wrench part and the daughter-board panel are rotatably connected by using a first rotation shaft; the wrench part and the handle part are rotatably connected by using a second rotation shaft; a key groove is provided on the second rotation shaft; the key groove and the key are matched; and in the initial state, the key of the sliding block abuts against the key groove of the second rotation shaft.

Further, the removal device further includes an adjustment apparatus, where the adjustment apparatus is connected to the thrust control apparatus and is configured to adjust thrust of the thrust control apparatus.

Specifically, the adjustment apparatus is a screw.

The technical solutions provided in the embodiments of the present invention bring the following beneficial effects: A wrench part and a handle part according to the embodiments of the present invention are in a split structure, and a thrust state is fed back to an operator by using a thrust control apparatus and maximum thrust is controlled, so that over-thrust is avoided, and the following problem in the prior art is solved: Sensory information cannot be fed back to an operator and maximum thrust cannot be controlled when thrust is too large, so that the operator is likely to continue to increase the thrust, thereby resulting in serious deformation or damage of a daughter board and a backplane.

BRIEF DESCRIPTION OF THE DRAWINGS

To illustrate the technical solutions in the embodiments of the present invention more clearly, the following briefly introduces the accompanying drawings required for describing the embodiments of the present invention. Apparently, the accompanying drawings in the following description show merely some embodiments of the present invention, and a person of ordinary skill in the art may still derive other drawings from these accompanying drawings without creative efforts.

DETAILED DESCRIPTION

To make the objectives, technical solutions, and advantages of the present invention more clearly, the following describes the embodiments of the present invention in further detail with reference to the accompanying drawings.

Embodiment 1

Figure 2A:
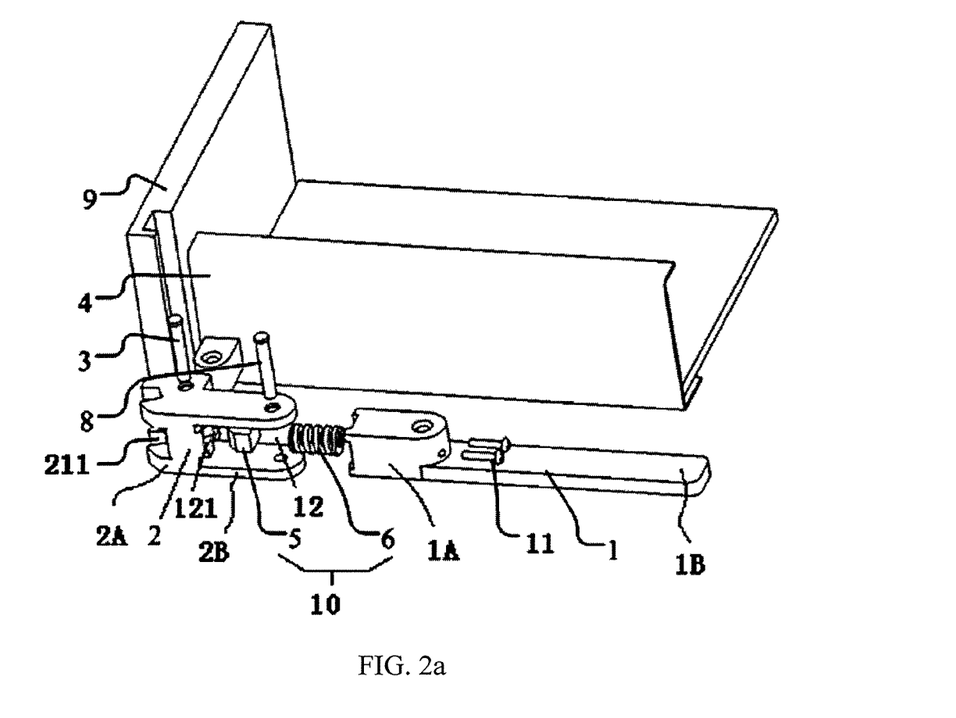
FIG. 2a is an exploded view of a part of the removal device according to Embodiment 1 of the present invention.
Figure 2B:
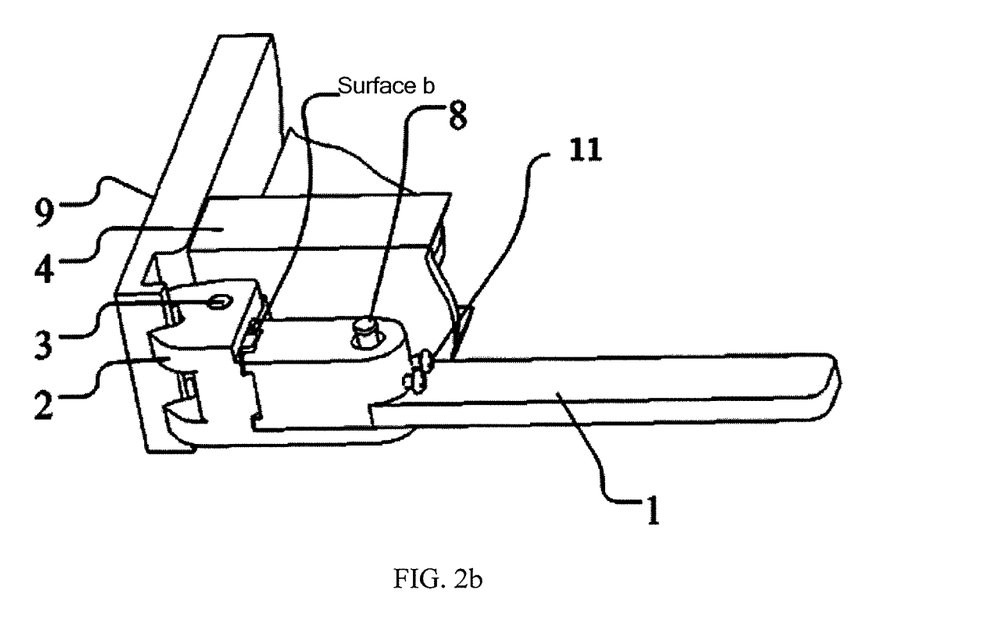
FIG. 2b is an overall assembly view of the removal device according to Embodiment 1 of the present invention.

As shown in FIG. 2a and further in FIG. 2b, this embodiment of the present invention is mainly described based on FIG. 2a. This embodiment of the present invention provides a removal device, disposed in a subrack 9, configured to assist in installation of a daughter board, and including a wrench part 2, a handle part 1, and a thrust control apparatus 10. The wrench part 2 and the handle part 1 are in a split structure, the wrench part 2 is rotatably connected to a daughter-board panel 4, so that the wrench part 2 can rotate relative to the daughter-board panel 4, and the wrench part 2 is rotatably connected to the handle part 1, so that the handle part 1 can rotate relative to the wrench part 2; the wrench part 2 includes a bayonet end 2A and a wrench connecting end 2B; a bayonet 211 is provided on the bayonet end 2A, and the bayonet 211 is clamped on the subrack 9 (see FIG. 2b); and the handle part 1 includes a handle connecting end 1A and a handle end 1B, where the handle end 1B is configured to apply force; the thrust control apparatus 10 is disposed at a junction of the wrench connecting end 2B and the handle connecting end 1A, and the thrust control apparatus 10 is configured to restrict motion of the handle part 1 relative to the wrench part 2, and control maximum thrust when force is applied to the handle end 1B.

The wrench part 2 and the handle part 1 according to this embodiment of the present invention are in a split structure, and a thrust state is fed back to an operator by using the thrust control apparatus 10 and maximum thrust is controlled, so that over-thrust is avoided, and the following problem in the prior art is solved: Sensory information cannot be fed back to an operator and maximum thrust cannot be controlled when thrust is too large, so that the operator is likely to continue to increase the thrust, thereby resulting in serious deformation or damage of a daughter board and a backplane.

Specifically, as shown in FIG. 2a, in this embodiment, a groove 12 is provided on the wrench connecting end 2B, and the groove 12 is configured to accommodate the handle connecting end 1A; a blind via 13 is provided on the handle connecting end 1A, and the blind via 13 is configured to accommodate the thrust control apparatus 10.

Figure 2C:
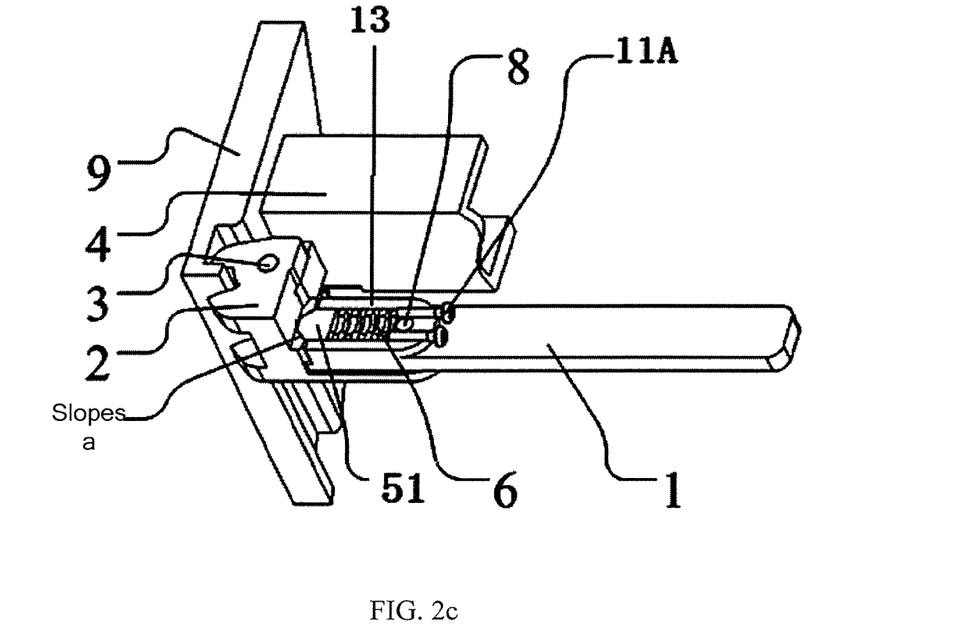
FIG. 2c is an assembly view of the thrust control apparatus according to Embodiment 1 of the present invention.

Specifically, as shown in FIG. 2c, in this embodiment, the thrust control apparatus 10 includes a sliding part 5 and an elastic part 6. The sliding part 5 and the elastic part 6 are installed in the blind via 13 in an outside-to-inside sequence. In an initial state, motion of the sliding part 5 is restricted under an action of counter-acting force of the elastic part 6, so as to restrict the handle part 1 to generating motion relative to the wrench part 2; and in a use state, by means of applying force on the handle end, the handle part 1 is driven to rotate, so that the sliding part 5 pushes the elastic part 6 to enable the elastic part 6 in a compressed state, which enable the sliding part 5 to detach from the groove 12, so as to control the maximum thrust. The initial state and the use state are relative concepts. In this embodiment, the initial state refers to a state when no force is applied to the thrust control apparatus 10, and the use state refers to a state when force is applied to the thrust control apparatus 10.

As shown in FIG. 2c, in this embodiment, the outside-to-inside sequence refers to a sequence from a mouth of the blind via 13 to a bottom of the blind via 13.

Specifically, as shown in FIG. 2c, in this embodiment, the elastic part 6 is preferably a spring. Definitely, a person skilled in the art may understand that, the elastic part 6 may also be an air cylinder, a hydraulic rod, or another part or component that has push and pull strokes.

More specifically, as shown in FIG. 2c, in this embodiment, the sliding part 5 is a sliding block 51; the wrench part 2 and the daughter-board panel 4 are rotatably connected by using a first rotation shaft 3; the wrench part 2 and the handle part 1 are rotatably connected by using a second rotation shaft 8; and in the initial state, the sliding block 51 abuts against a groove bottom 121 (see FIG. 2a) of the groove 12 (see FIG. 2a).

As shown in FIG. 2a, the groove bottom 121 is a relative concept and refers to a surface of the sliding block 51 (see FIG. 2c) relative to the groove 12.

As shown in FIG. 2c, in this embodiment, a shape of a contact position between the sliding block 51 and the groove bottom 121 is a trapezoid. The trapezoid has two slopes a, a trapezoid groove bottom matching the trapezoid is provided at the corresponding groove bottom 121.

Definitely, a person skilled in the art may understand that, the shape of the contact position between the sliding block 51 and the groove bottom 121 (see FIG. 2a) may also be a circular arc or a slope, and a circular arc groove bottom or a slope groove bottom matching the circular arc or the slope is provided at the corresponding groove bottom 121 (see FIG. 2a).

Further, as shown in FIG. 2c, the removal device further includes an adjustment apparatus 11, where the adjustment apparatus 11 is connected to the thrust control apparatus 10 and is configured to adjust thrust of the thrust control apparatus 10.

Specifically, as shown in FIG. 2c, in this embodiment, the adjustment apparatus 11 (see FIG. 2a) is a screw, that is, a first screw 11A. The first screw 11A passes through the handle connecting end 1A (see FIG. 2a) of the handle part 1 and abuts against the elastic part 6; and the amount of compression of the elastic part 6 is adjusted by rotating the first screw 11A, so as to implement adjustment of the thrust. The structure is simple and the adjustment is convenient and accurate.

A working principle of the embodiment of the present invention is as follows:

As shown in FIG. 2a, the blind via 13 is provided in the middle of the handle connecting end 1A, and the elastic part 6 and the sliding block 51 (see FIG. 2c) are installed in the blind via 13. After the installation, the elastic part 6 is pre-compressed by a certain length, so that the elastic part 6 enables the sliding block 51 (see FIG. 2c) to abut against the groove 12 on the wrench connecting end of the wrench part 2, the wrench part 2 is clamped by the sliding block 51 (see FIG. 2c), so that no relative motion is generated between the wrench part 2 and the handle part 1; when thrust F is applied to the handle end 1B, according to a lever principle, the wrench part 2 applies the force to the daughter-board panel 4 after the force is increased by the first rotation shaft 3; the daughter board is pushed into the subrack 9 under an action of the acting force, and resistance of pushing the daughter board is increased after a daughter board connector contacts with a backplane connector, which causes that tension applied to the sliding block 51 (see FIG. 2c) on the slope a is also increased; and when force obtained in a direction of the handle part 1 by decomposing the tension is larger than elastic force of the elastic part 6, the sliding block 51 (see FIG. 2c) pushes the elastic part 6 to enable the elastic part 6 in a compressed state, and meanwhile the sliding block 51 (see FIG. 2c) starts to detach from the groove 12 on the wrench connecting end 2B, and in this case, the handle part 1 rotates relative to the wrench part 2. In this way, a person applying the force can feel that the amount of rotation of the handle part 1 is suddenly increased. After receiving this feedback information, the person applying the force can stop the thrust, so as to prevent the backplane or the daughter board from being damaged due to over-thrust; in addition, when the amount of compression of the elastic part 6 is large enough to enable the sliding block 51 (see FIG. 2c) to detach from the groove 12 on the wrench connecting end 2B, the thrust conducted from the sliding block 51 (see FIG. 2c) to the wrench part 2 disappears, that is, the daughter board is not applied with the thrust even if the thrust F continues to be applied. In this way, maximum force applied to the daughter board in the entire process is force before the sliding block 51 (see FIG. 2c) detaches from the groove 12 on the wrench part 2. This maximum thrust depends on the elastic force of the elastic part 6, an angle of the slope a (see FIG. 2c), and a ratio of an arm of force of the removal device. According to an actual requirement for a torque, a maximum torque can be adjusted by adjusting the first screw 11A (see FIG. 2c) and the amount of pre-compression of the elastic part 6, thereby achieving an effect of controlling the maximum thrust.

According to this embodiment of the present invention, the removal device controls the thrust when the daughter board is inserted, a super-minimum fitting distance is reached between the daughter board connector and the backplane connector, and meanwhile, it is ensured that the thrust is not large enough to damage the daughter board or the backplane.

Embodiment 2

Figure 3A:
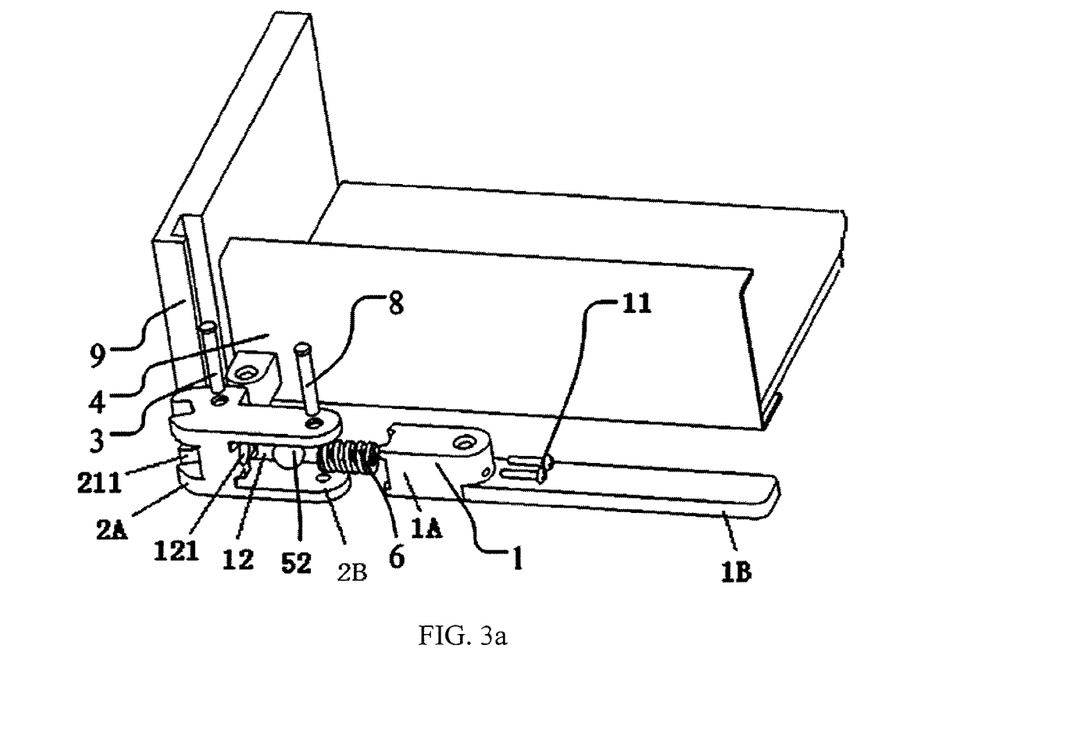
FIG. 3a is an exploded view of a part of the removal device according to Embodiment 2 of the present invention.
Figure 3B:
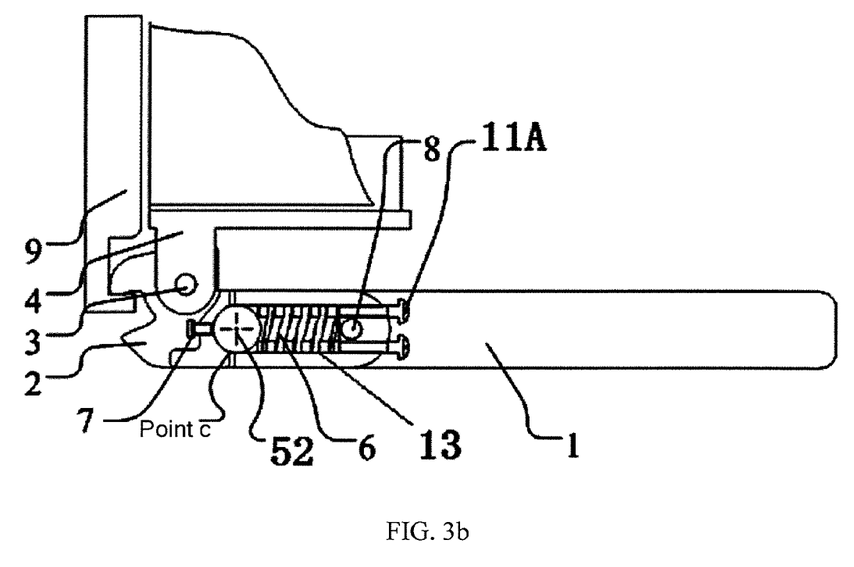
FIG. 3b is an assembly view of the thrust control apparatus according to Embodiment 2 of the present invention.

As shown in FIG. 3a and further in FIG. 3b, this embodiment is mainly described based on FIG. 3a. A difference between this embodiment and the embodiment shown in FIG. 2a is as follows: The sliding part 5 is a bead 52; in an initial state, the bead 52 abuts against the groove bottom 121 of the groove 12; and a concave surface that matches the bead 52 is provided on the groove bottom 121 of the groove 12; the remaining structure is the same, and in this embodiment, the part with the same structure is not described again.

Specifically, the bead 52 is preferably made of metal.

Specifically, as shown in FIG. 3a, in this embodiment, the wrench part 2 and the daughter-board panel 4 are rotatably connected by using a first rotation shaft 3; and the wrench part 2 and the handle part 1 are rotatably connected by using a second rotation shaft 8.

Further, as shown in FIG. 3b, in this embodiment, a second screw 7 is disposed on the groove bottom 121 (see FIG. 3a). In the initial state, the second screw 7 abuts against the bead 52. A depth that the bead 52 is sunk into the groove bottom of the groove 12 (see FIG. 3a) can be adjusted by adjusting the second screw 7, so as to adjust decomposed force in a horizontal direction at a point c, thereby achieving an effect of controlling the maximum thrust.

A working principle of this embodiment is as follows:

As shown in FIG. 3a, when thrust F is applied to the handle end 1B, according to a lever principle, the wrench part 2 applies the force on the daughter-board panel 4 after the force is increased by using the first rotation shaft 3; the daughter board is pushed into the subrack 9 under an action of the force, and resistance of pushing the daughter board is increased after a daughter board connector contacts with a backplane connector, which causes that tension applied to the bead 52 (see FIG. 3b) at the point c is also increased; and when force obtained in a direction of the handle part 1 by decomposing the tension is larger than elastic force of the elastic part 6, the bead 52 (see FIG. 3b) pushes the elastic part 6 to enable the elastic part 6 in a compressed state, and meanwhile the bead 52 (see FIG. 3b) starts to detach from the groove 12 on the wrench connecting end 2B, and in this case, the handle part 1 rotates relative to the wrench part 2. In this way, a person applying the force can feel that the amount of rotation of the handle part 1 is suddenly increased. After receiving this feedback information, the person applying the force can stop the thrust, so as to prevent the backplane or the daughter board from being damaged due to over-thrust; in addition, when the amount of compression of the elastic part 6 is large enough to enable the bead 52 to detach from the groove 12 on the wrench connecting end 2B, the thrust conducted from the bead 52 (see FIG. 3b) to the wrench part 2 disappears, so that the thrust applied to the daughter board disappears. In this way, maximum force applied to the daughter board in the entire process is force before the bead 52 (see FIG. 3b) detaches from the groove 12 on the wrench connecting end 2B. This maximum thrust depends on the elastic force of the elastic part 6, a position of the point c (see FIG. 3b), and a radio of an arm of force of the removal device. According to an actual requirement for a torque, a maximum torque can be adjusted by adjusting the first screw 11A and the amount of pre-compression of the elastic part 6, thereby achieving an effect of controlling the maximum thrust, or the depth that the bead 52 (see FIG. 3b) is sunk into the groove bottom of the groove 12 is adjusted by adjusting the second screw 7, so as to adjust the decomposed force in the horizontal direction at the point c (see FIG. 3b), thereby achieving the effect of controlling the maximum thrust.

According to this embodiment of the present invention, the removal device controls the thrust when the daughter board is inserted, a super-minimum fitting distance is reached between the daughter board connector and the backplane connector, and meanwhile, it is ensured that the thrust is not large enough to damage the daughter board or the backplane.

Embodiment 3

Figure 4A:
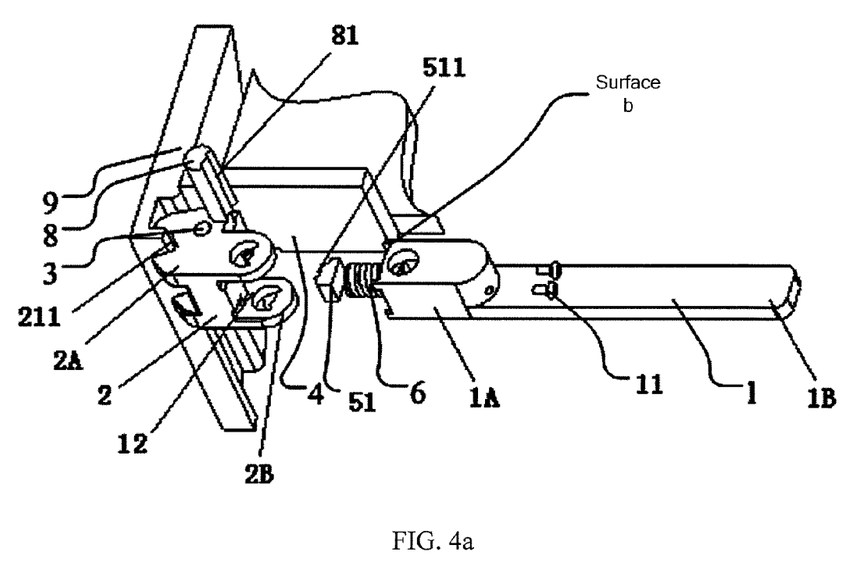
FIG. 4a is an exploded view of a part of the removal device according to Embodiment 3 of the present invention.
Figure 4B:
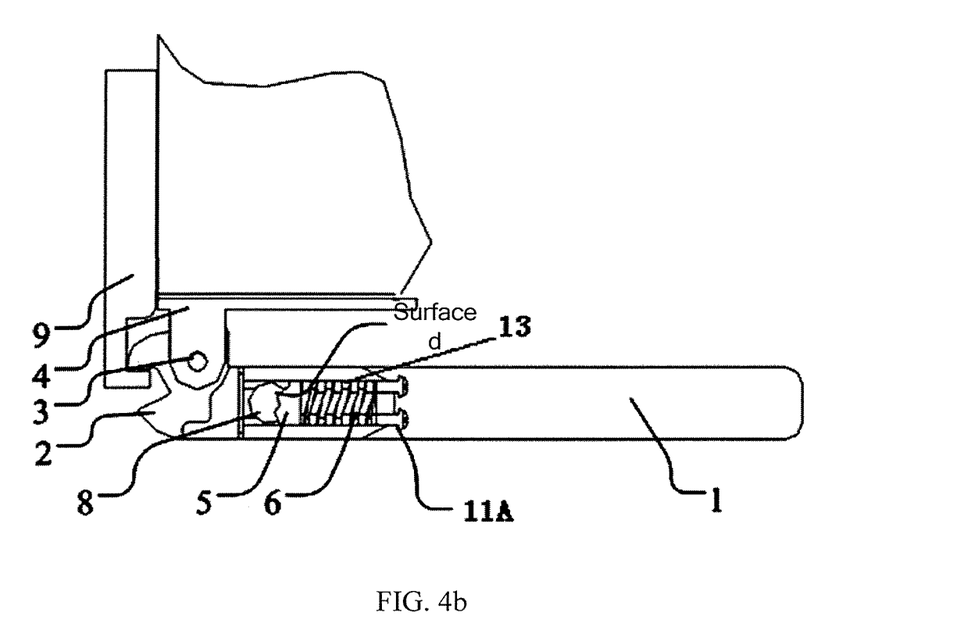
FIG. 4b is an assembly view of the thrust control apparatus according to Embodiment 3 of the present invention.

As shown in FIG. 4a and further in FIG. 4b, this embodiment is mainly described based on FIG. 4a. A difference between this embodiment and the embodiment shown in FIG. 2a is as follows: The sliding part 5 is a sliding block 51; a key 511 is provided on one end of the sliding block 51; the wrench part 2 and the daughter-board panel 4 are rotatably connected by using a first rotation shaft 3; the wrench part 2 and the handle part 1 are rotatably connected by using a second rotation shaft 8; a key groove 81 is provided on the second rotation shaft 8; the key groove 81 and the key 511 are matched; and in an initial state, the key 511 of the sliding block 51 abuts against the key groove 81 of the second rotation shaft 8. The remaining structure is the same, and in this embodiment, the same part is not described again.

A working principle of this embodiment is as follows:

As shown in FIG. 4a, the handle part 1 and the wrench part 2 are hinged by using the second rotation shaft 8; the handle part 1 can rotate around the second rotation shaft 8 within a certain range, and the rotation range is restricted by a fitting surface b of the handle part 1 and the wrench part 2; the second rotation shaft 8 is clamped on the wrench connecting end 2B through the key groove 81 and cannot rotate relative to the wrench connecting end; the wrench part 2 is hinged to the daughter-board panel 4 by using the first rotation shaft 3, and the wrench part 2 can rotate around the first rotation shaft 3; the blind via 13 is provided in the middle of the handle connecting end 1A, and the elastic part 6 and the sliding block 51 are installed in the blind via 13. After the installation, the elastic part 6 is pre-compressed by a certain length, so that the elastic part 6 enables the sliding block 51 to abut against the key groove 81 of the second rotation shaft 8, so that the second rotation shaft 8 and the wrench part 2 are clamped by the sliding block 51 (see FIG. 4b), and in this case, no relative motion is generated between the wrench part 2 and the handle part 1; when thrust is applied to the handle end 1B, according to a lever principle, the wrench part 2 applies the force to the daughter card after the force is increased by the first rotation shaft 3; the daughter board is pushed into the subrack 9 under an action of the acting force, resistance of pushing the daughter board is increased after a daughter board connector contacts with a backplane connector, and tension applied to the sliding block 51 (see FIG. 4b) on a surface d (see FIG. 4b) is also increased; when force obtained in a direction of the handle part 1 by decomposing the tension is larger than elastic force of the elastic part 6, the sliding block 51 (see FIG. 4b) pushes the elastic part 6 to enable the elastic part 6 in a compressed state; and when the amount of compression of the elastic part 6 is large enough to enable the sliding block 51 (see FIG. 4b) to detach from the key groove 81 of the second rotation shaft 8, the thrust conducted from the sliding block 51 (see FIG. 4b) to the wrench part 2 disappears, so that the thrust applied to the daughter board disappears. In this way, maximum force applied to the daughter board in the entire process is force before the sliding block 51 detaches from the key groove 81 of the second rotation shaft 8. This maximum thrust depends on the elastic force of the elastic part 6, an angle of the surface d (see FIG. 4b), and a ratio of an arm of force of the removal device. According to an actual requirement for a torque, a maximum torque can be adjusted by adjusting the first screw 11A (see FIG. 4b) and the amount of pre-compression of the elastic part 6, thereby achieving an effect of controlling the maximum thrust.

Embodiment 4

Figure 5A:
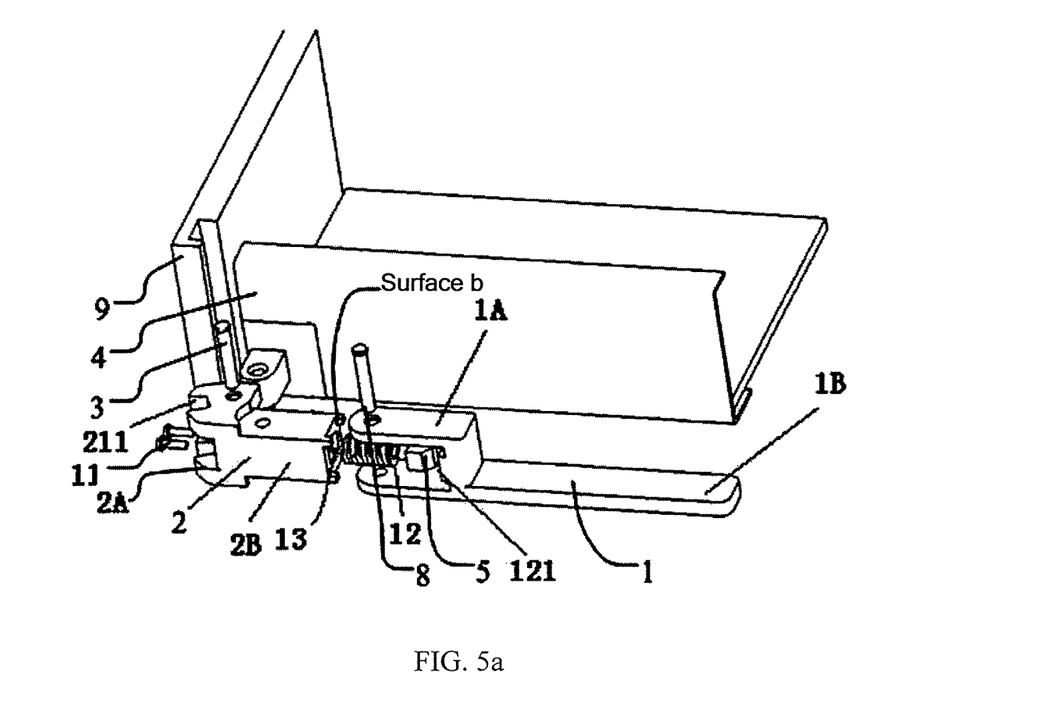
FIG. 5a is an exploded view of a part of the removal device according to Embodiment 4 of the present invention.
Figure 5B:
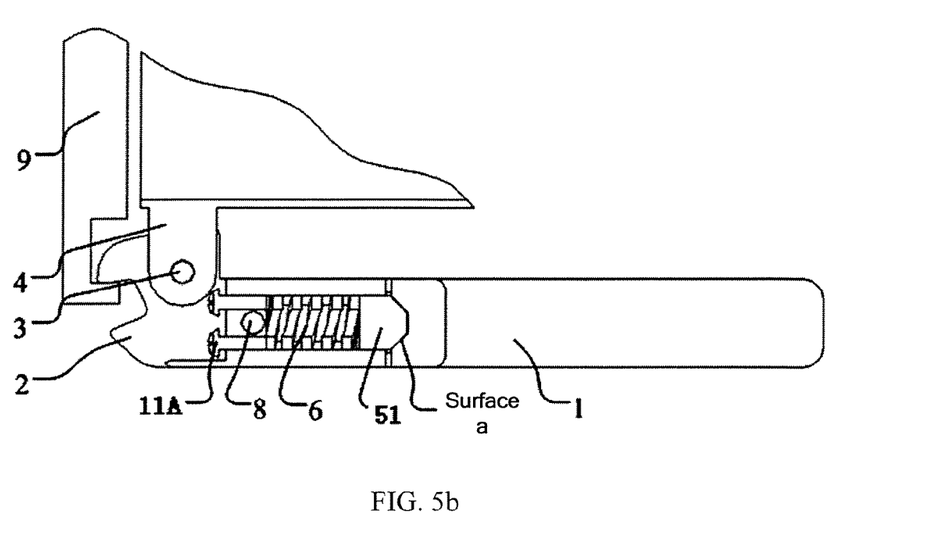
FIG. 5b is an assembly view of the thrust control apparatus according to Embodiment 4 of the present invention.

As shown in FIG. 5a and further in FIG. 5b, the removal device includes a wrench part 2, a handle part 1, and a thrust control apparatus 10. The wrench part 2 and the handle part 1 are in a split structure, the wrench part 2 is rotatably connected to a daughter-board panel 4, so that the wrench part 2 can rotate relative to the daughter-board panel 4, and the wrench part 2 is rotatably connected to the handle part 1, so that the handle part 1 can rotate relative to the wrench part 2; the wrench part 2 includes a bayonet end 2A and a wrench connecting end 2B; a bayonet 211 is provided on the bayonet end 2A, and the bayonet 211 is clamped on a subrack 9; the handle part 1 includes a handle connecting end 1A and a handle end 1B, and the handle end 1B is configured to apply force; the thrust control apparatus 10 is disposed at a junction of the wrench connecting end 2B and the handle connecting end 1A; in an initial state, the thrust control apparatus 10 is configured to restrict motion of the handle part 1 relative to the wrench part 2; and in a use state, maximum thrust is controlled by using the thrust control apparatus 10, so as to avoid over-thrust.

Specifically, as shown in FIG. 5a, in this embodiment, a blind via 13 (see FIG. 5b) is provided on the wrench connecting end 2B, and the blind via 13 (see FIG. 5b) is configured to accommodate the thrust control apparatus 10; a groove 12 is provided on the handle connecting end 1A, and the groove 12 is configured to accommodate the handle connecting end 1A.

Specifically, as shown in FIG. 5a, the thrust control apparatus 10 includes a sliding part 5 and an elastic part 6. The sliding part 5 and the elastic part 6 are installed in the blind via 13 in an outside-to-inside sequence. In the initial state, motion of the sliding part 5 is restricted under an action of counter-acting force of the elastic part 6, so as to restrict the handle part 1 to generating motion relative to the wrench part 2; and in the use state, by means of applying force on the handle end 1B, the handle part 1 is driven to rotate, so that the sliding part 5 pushes the elastic part 6 to enable the elastic part 6 in a compressed state, thereby enable the sliding part 5 to detach from the groove 12, so as to control the maximum thrust.

Specifically, as shown in FIG. 5b, in this embodiment, the elastic part 6 is preferably a spring. Definitely, a person skilled in the art may understand that, the elastic part 6 may also be an air cylinder, a hydraulic rod, or another part or component that has push and pull strokes.

More specifically, as shown in FIG. 5a, in this embodiment, the sliding part 5 is a sliding block 51 (see FIG. 5b); the wrench part 2 and the daughter-board panel 4 are rotatably connected by using a first rotation shaft 3; the wrench part 2 and the handle part 1 are rotatably connected by using a second rotation shaft 8; and in the initial state, the sliding block 51 abuts against a groove bottom 121 of the groove 12.

As shown in FIG. 5a, the groove bottom 121 is a relative concept and refers to a surface of the sliding block 51 (see FIG. 5b) relative to the groove 12.

As shown in FIG. 5b, in this embodiment, a shape of a contact position between the sliding block 51 and the groove bottom 121 (see FIG. 5a) is a trapezoid. The trapezoid has two slopes a, a trapezoid groove bottom matching the trapezoid is provided at the corresponding groove bottom 121 (see FIG. 5a).

Definitely, a person skilled in the art may understand that, the shape of the contact position between the sliding block 51 and the groove bottom 121 (see FIG. 5a) may also be a circular arc or a slope, and a circular arc groove bottom or a slope groove bottom matching the circular arc or the slope is provided at the corresponding groove bottom 121 (see FIG. 5a).

Further, as shown in FIG. 5b, the removal device further includes an adjustment apparatus 11, where the adjustment apparatus 11 is connected to the thrust control apparatus 10 and is configured to adjust thrust of the thrust control apparatus 10.

Specifically, as shown in FIG. 5b, in this embodiment, the adjustment apparatus 11 is a screw, that is, a first screw 11A. The first screw 11A passes through the handle connecting end 1A of the handle part 1 and abuts against the elastic part 6; and the amount of compression of the elastic part 6 is adjusted by rotating the first screw 11A, so as to implement adjustment of the thrust. The structure is simple and the adjustment is convenient and accurate.

A working principle of this embodiment is as follows:

As shown in FIG. 5a, the blind via 13 is provided in the middle of the wrench connecting end 2B, and the elastic part 6 and the sliding block 51 are installed in the blind via 13. After the installation, the elastic part 6 is pre-compressed by a certain length, so that the elastic part 6 enables the sliding block 51 to abut against the groove 12 of the handle connecting end 1A, and the handle part 1 is clamped by the sliding block 51 (see FIG. 5b), so that no relative motion is generated between the wrench part 2 and the handle part 1; when thrust F is applied to the handle end 1B, according to a lever principle, the wrench part 2 applies the force to the daughter-board panel 4 after the force is increased by the first rotation shaft 3; a daughter board is pushed into the subrack 9 under an action of the acting force, and resistance of pushing the daughter board is increased after a daughter board connector contacts with a backplane connector, which causes that tension applied to the sliding block 51 on a surface a is also increased; and when force obtained in a direction of the handle part 1 by decomposing the tension is larger than elastic force of the elastic part 6, the sliding block 51 pushes the elastic part 6 to enable the elastic part 6 in a compressed state, and meanwhile the sliding block 51 (see FIG. 5b) starts to detach from the groove 12 on the handle connecting end 1A, and in this case, the handle part 1 rotates relative to the wrench part 2. In this way, a person applying the force can feel that the amount of rotation of the handle part 1 is suddenly increased. After receiving this feedback information, the person applying the force can stop the thrust, so as to prevent the backplane or the daughter board from being damaged due to over-thrust; in addition, when the amount of compression of the elastic part 6 is large enough to enable the sliding block 51 to detach from the groove 12 on the handle connecting end 1A, the thrust conducted from the sliding block 51 (see FIG. 5b) to the wrench part 2 disappears, and the daughter board is not applied with the thrust even if the thrust F continues to be applied. In this way, maximum force applied to the daughter board in the entire process is force before the sliding block 51 detaches from the groove 12 on the handle connecting end 1A. This maximum thrust depends on the elastic force of the elastic part 6, an angle of the surface a, and a radio of an arm of force of the removal device. According to an actual requirement for a torque, a maximum torque can be adjusted by adjusting the first screw 11A (see FIG. 5b) and the amount of pre-compression of the elastic part 6, thereby achieving an effect of controlling the maximum thrust.

According to this embodiment of the present invention, the removal device controls the thrust when the daughter board is inserted, a super-minimum fitting distance is reached between the daughter board connector and the backplane connector, and meanwhile, it is ensured that the thrust is not large enough to damage the daughter board or the backplane.

Embodiment 5

Figure 6A:
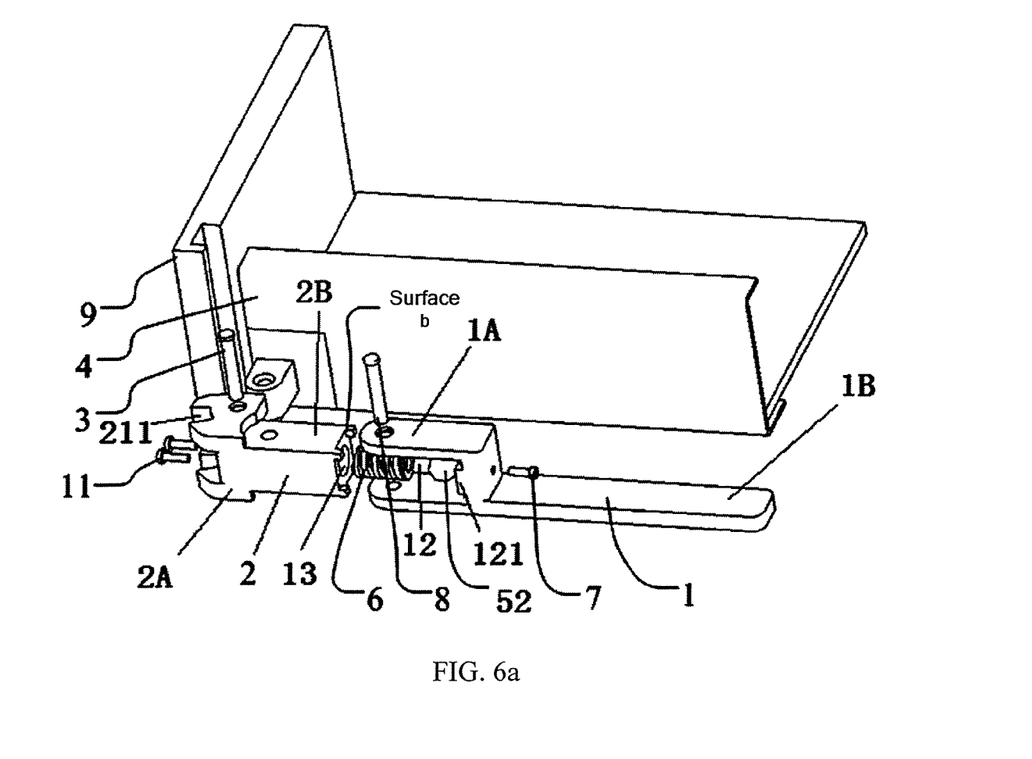
FIG. 6a is an exploded view of a part of the removal device according to Embodiment 5 of the present invention.

As shown in FIG. 6a and further in FIG. 6b, a difference between this embodiment and the embodiment shown in FIG. 5a is as follows: The sliding part 5 is a bead 52; in an initial state, the bead 52 abuts against the groove bottom 121 of the groove 12; and a concave surface that matches the bead 52 is provided on the groove bottom 121 of the groove 12; the remaining structure is the same, and in this embodiment, the same part is not described again.

Specifically, the bead 52 is preferably made of metal.

Specifically, as shown in FIG. 6a, the wrench part 2 and the daughter-board panel 4 are rotatably connected by using a first rotation shaft 3; and the wrench part 2 and the handle part 1 are rotatably connected by using a second rotation shaft 8.

Figure 6B:
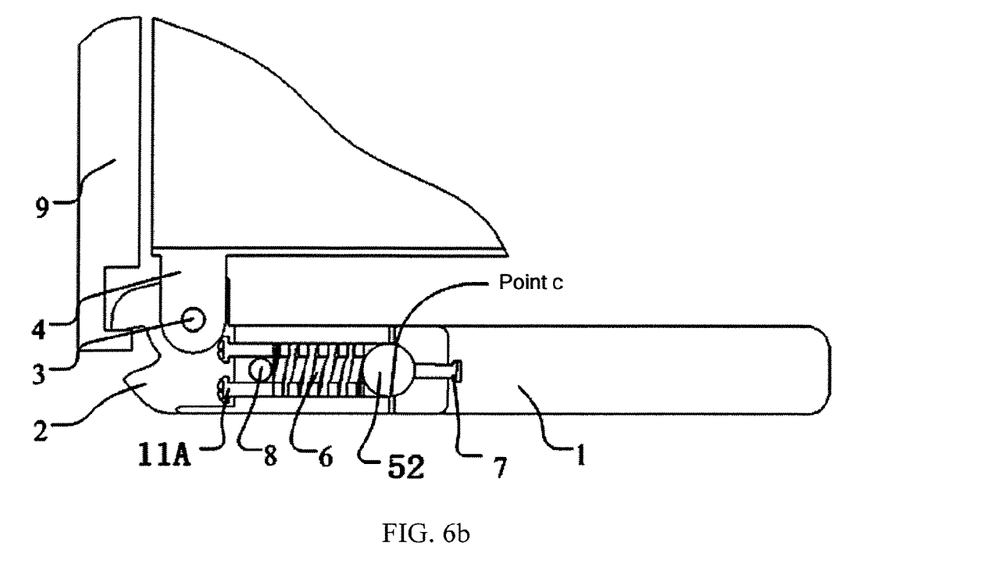
FIG. 6b is an assembly view of the thrust control apparatus according to Embodiment 5 of the present invention.

Further, as shown in FIG. 6b, in this embodiment, a second screw 7 is disposed on the groove bottom 121 (see FIG. 6b). In the initial state, the second screw 7 abuts against the bead 52. A depth that the bead 52 is sunk into the groove bottom of the groove 12 can be adjusted by adjusting the second screw 7, so as to adjust decomposed force in a horizontal direction at a point c, thereby achieving an effect of controlling the maximum thrust.

A working principle of this embodiment of the present invention is as follows:

As shown in FIG. 6a, the blind via 13 is provided in the middle of the wrench part 2, and the elastic part 6 and the bead 52 are installed in the blind via 13. After the installation, the elastic part 6 is pre-compressed by a certain length, so that the elastic part 6 enables the bead 52 (see FIG. 6b) to abut against the groove 12 on the handle connecting end 1A, and the handle part 1 is clamped by the bead 52 (see FIG. 6b), so that no relative motion is generated between the wrench part 2 and the handle part 1; when thrust F is applied to the handle end 1B, according to a lever principle, the wrench part 2 applies the force to the daughter-board panel 4 after the force is increased by the first rotation shaft 3; the daughter board is pushed into the subrack 9 under an action of the acting force, and resistance of pushing the daughter board is increased after a daughter board connector contacts with a backplane connector, which causes that tension applied to the bead 52 (see FIG. 6b) at the point c (see FIG. 6b) is also increased; and when force obtained in a direction of the handle part 1 by decomposing the tension is larger than elastic force of the elastic part 6, the bead 52 (see FIG. 6b) pushes the elastic part 6 to enable the elastic part 6 in a compressed state, and meanwhile the bead 52 (see FIG. 6b) starts to detach from the groove 12 on the handle connecting end 1A, and in this case, the handle part 1 rotates relative to the wrench part 2. In this way, a person applying the force can feel that the amount of rotation of the handle part 1 is suddenly increased. After receiving this feedback information, the person applying the force can stop the thrust, so as to prevent the backplane or the daughter board from being damaged due to over-thrust; in addition, when the amount of compression of the elastic part 6 is large enough to enable the bead 52 (see FIG. 6b) to detach from the groove 12 on the handle connecting end 1A, the thrust conducted from the bead 52 (see FIG. 6b) to the wrench part 2 disappears, and the daughter board is not applied with the thrust even if the thrust F continues to be applied. In this way, maximum force applied to the daughter board in the entire process is force before the bead 52 (see FIG. 6b) detaches from the groove 12 on the handle connecting end 1A. This maximum thrust depends on the elastic force of the elastic part 6, a position of the point c (see FIG. 6b), and a radio of an arm of force of the removal device. According to an actual requirement for a torque, a maximum torque can be adjusted by adjusting the first screw 11A and the amount of pre-compression of the elastic part 6, thereby achieving an effect of controlling the maximum thrust, or the depth that the bead 52 (see FIG. 6b) is sunk into the groove 12 is adjusted by adjusting the second screw 7, so as to adjust the decomposed force of the bead in the horizontal direction at the point c, thereby achieving the effect of controlling the maximum thrust.

According to this embodiment of the present invention, the removal device controls the thrust when the daughter board is inserted, a super-minimum fitting distance is reached between the daughter board connector and the backplane connector, and meanwhile, it is ensured that the thrust is not large enough to damage the daughter board or the backplane.

Embodiment 6

Figure 7A:
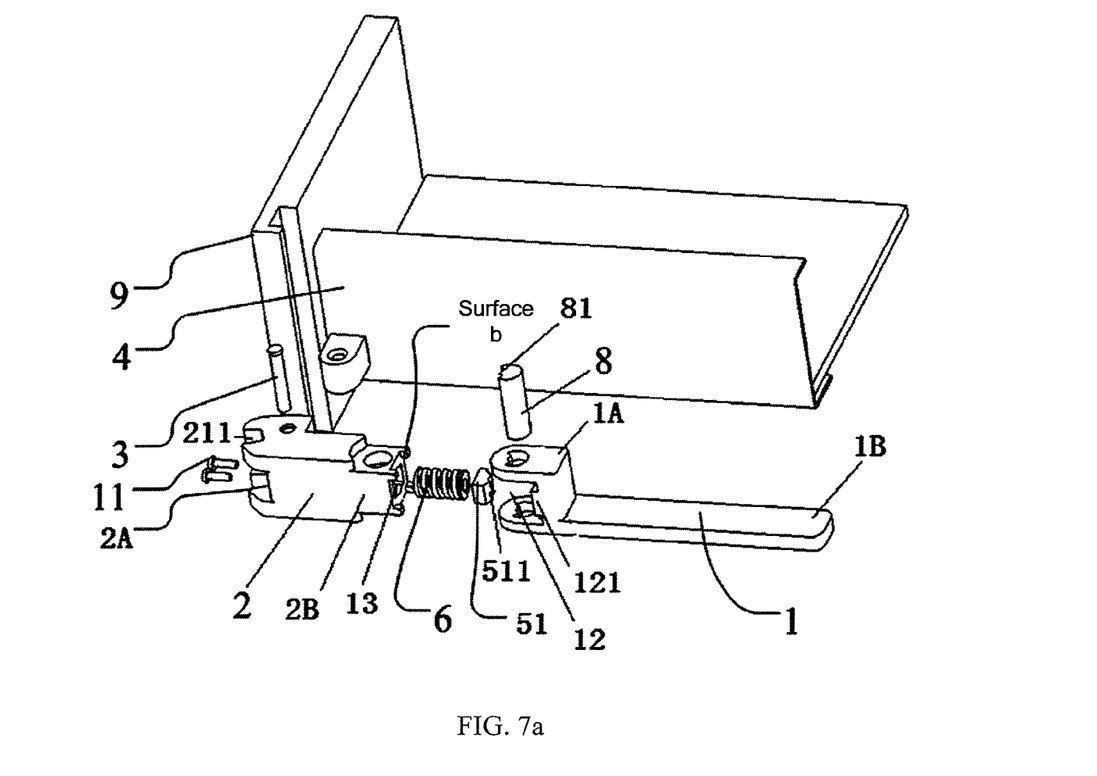
FIG. 7a is an exploded view of a part of the removal device according to Embodiment 6 of the present invention.
Figure 7B:
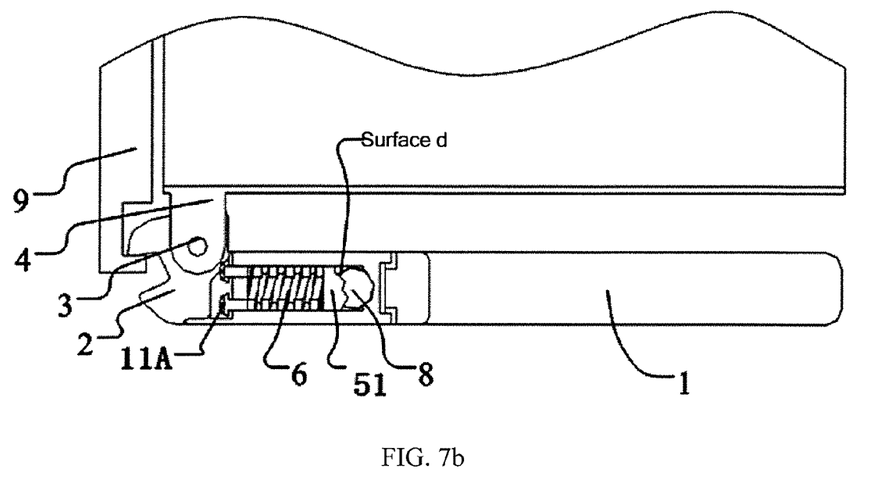
FIG. 7b is an assembly view of the thrust control apparatus according to Embodiment 6 of the present invention.

As shown in FIG. 7a and further in FIG. 7b, this embodiment is mainly described based on FIG. 7a. A difference between this embodiment and the embodiment shown in FIG. 5a is as follows: The sliding part 5 is a sliding block 51; a key 511 is provided on one end of the sliding block 51; the wrench part 2 and the daughter-board panel 4 are rotatably connected by using a first rotation shaft 3; the wrench part 2 and the handle part 1 are rotatably connected by using a second rotation shaft 8; a key groove 81 is provided on the second rotation shaft 8; the key groove 81 and the key 511 are matched; and in an initial state, the key 511 of the sliding block 51 abuts against the key groove 81 of the second rotation shaft 8. The remaining structure is the same, and in this embodiment, the same part is not described again.

A working principle of this embodiment is as follows:

As shown in FIG. 7a, the second rotation shaft 8 is clamped on the handle part 1 through the key groove 81 and cannot rotate relative to the handle part 1; the handle part 1 and the wrench part 2 are hinged by using the second rotation shaft 8; the handle part 1 and the second rotation shaft 8 simultaneously rotate, relative to the wrench part 2, around an axis of the second rotation shaft 8 within a certain range, and the rotation range is restricted by a fitting surface b (see FIG. 7a) of the handle part 1 and the wrench part 2; the wrench part 2 is hinged to the daughter-board panel 4 by using the first rotation shaft 3, and the wrench part 2 can rotate around the first rotation shaft 3; a blind via 13 is provided in the middle of the wrench connecting end 2B, and the elastic part 6 and the sliding block 51 are installed in the blind via 13. After the installation, the elastic part 6 is pre-compressed by a certain length, so that the elastic part 6 enables the sliding block 51 to abut against the key groove 81 of the second rotation shaft 8, so that the second rotation shaft 8 and the wrench part 2 are clamped by the sliding block 51, and in this case, no relative motion is generated between the wrench part 2 and the handle part 1; when thrust is applied to the handle end 1B, according to a lever principle, the wrench part 2 applies the force on the daughter card after the force is increased by the first rotation shaft 3; the daughter board is pushed into the subrack 9 under an action of the acting force, resistance of pushing the daughter board is increased after a daughter board connector contacts with a backplane connector, and tension applied to the sliding block 51 on a surface d (see FIG. 7b) is also increased; when force obtained in a direction of the handle part 1 by decomposing the tension is larger than elastic force of the elastic part 6, the sliding block 51 pushes the elastic part 6 to enable the elastic part 6 in a compressed state; and when the amount of compression of the elastic part 6 is large enough to enable the sliding block 51 to detach from the key groove 81 of the second rotation shaft 8, the thrust conducted from the sliding block 51 to the wrench part 2 disappears, so that the thrust applied to the daughter board disappears. In this way, maximum force applied to the daughter board in the entire process is force before the sliding block 51 detaches from the key groove 81 of the second rotation shaft 8. This maximum thrust depends on the elastic force of the elastic part 6, an angle of the surface d, and a ratio of an arm of force of the removal device. According to an actual requirement for a torque, a maximum torque can be adjusted by adjusting the first screw 11A (see FIG. 7b) and the amount of pre-compression of the elastic part 6, thereby achieving an effect of controlling the maximum thrust.

According to this embodiment of the present invention, the removal device controls the thrust when the daughter board is inserted, a super-minimum fitting distance is reached between the daughter board connector and the backplane connector, and meanwhile, it is ensured that the thrust is not large enough to damage the daughter board or the backplane.

The foregoing descriptions are merely exemplary embodiments of the present invention, but are not intended to limit the present invention. Any modification, equivalent replacement, or improvement made within the spirit and principle of the present invention shall all fall within the protection scope of the present invention.

What is claimed is:

1. A removal device disposed in a subrack and configured to assist in installation of a daughter board, the removal device comprising:
    a wrench part, a handle part, and a thrust control apparatus, wherein the wrench part and the handle part are in a split structure, the wrench part is rotatably connected to a daughter-board panel, so that the wrench part can rotate relative to the daughter-board panel, and the wrench part is rotatably connected to the handle part, so that the handle part can rotate relative to the wrench part;
    wherein the wrench part comprises a bayonet end and a wrench connecting end, wherein a bayonet is provided on the bayonet end, the bayonet is clamped on a shelf;
    wherein the handle part comprises a handle connecting end and a handle end, and the handle end is configured to apply force;
    wherein the thrust control apparatus is disposed at a junction of the wrench connecting end and the handle connecting end, and the thrust control apparatus is configured to restrict motion of the handle part relative to the wrench part, and control maximum thrust when force is applied to the handle end; and
    wherein a groove is provided on the wrench connecting end, the groove is configured to accommodate the handle connecting end, a blind via is provided on the handle connecting end, and the blind via is configured to accommodate the thrust control apparatus.

2. The removal device according to claim 1, wherein the thrust control apparatus comprises a sliding part and an elastic part, wherein:
    the sliding part and the elastic part are installed in the blind via in an outside-to-inside sequence;
    in an initial state, motion of the sliding part is restricted under an action of counter-acting force of the elastic part, so as to restrict the handle part to generating motion relative to the wrench part; and
    in a use state, by means of applying force on the handle, the handle is driven to rotate, so that the sliding part pushes the elastic part to enable the elastic part in a compressed state, thereby enable the sliding part to detach from the groove, so as to control the maximum thrust.

3. The removal device according to claim 2, wherein:
    the sliding part is a sliding block;
    the wrench part and the daughter-board panel are rotatably connected by using a first rotation shaft;
    the wrench part and the handle part are rotatably connected by using a second rotation shaft; and
    in the initial state, the sliding block abuts against a groove bottom of the groove.

4. The removal device according to claim 2, wherein:
    the sliding part is a bead;
    the wrench part and the daughter-board panel are rotatably connected by using a first rotation shaft;
    the wrench part and the handle part are rotatably connected by using a second rotation shaft; and
    in the initial state, the bead abuts against a groove bottom of the groove, and a concave surface that matches the bead is provided on the groove bottom of the groove.

5. The removal device according to claim 2, wherein:
    the sliding part is a sliding block;
    a key is arranged on one end of the sliding block; the wrench part and the daughter-board panel are rotatably connected by using a first rotation shaft;
    the wrench part and the handle part are rotatably connected by using a second rotation shaft;
    a key groove is provided on the second rotation shaft;
    the key groove and the key are matched; and
    in the initial state, the key of the sliding block abuts against the key groove of the second rotation shaft.

6. A removal device disposed in a subrack and configured to assist in installation of a daughter board, the removal device comprising:
    a wrench part, a handle part, and a thrust control apparatus, wherein the wrench part and the handle part are in a split structure, the wrench part is rotatably connected to a daughter-board panel, so that the wrench part can rotate relative to the daughter-board panel, and the wrench part is rotatably connected to the handle part, so that the handle part can rotate relative to the wrench part;
    wherein the wrench part comprises a bayonet end and a wrench connecting end, wherein a bayonet is provided on the bayonet end, the bayonet is clamped on a shelf;
    wherein the handle part comprises a handle connecting end and a handle end, and the handle end is configured to apply force;
    wherein the thrust control apparatus is disposed at a junction of the wrench connecting end and the handle connecting end, and the thrust control apparatus is configured to restrict motion of the handle part relative to the wrench part, and control maximum thrust when force is applied to the handle end; and wherein a blind via is provided on the wrench connecting end, the blind via is configured to accommodate the thrust control apparatus, a groove is provided on the handle connecting end, and the groove is configured to accommodate the handle connecting end.

7. The removal device according to claim 6, wherein the thrust control apparatus comprises a sliding part and an elastic part, wherein:
the sliding part and the elastic part are installed in the blind via in an outside-to-inside sequence;
in an initial state, motion of the sliding part is restricted under an action of counter-acting force of the elastic part, so as to restrict the handle part to generating motion relative to the wrench part; and
in a use state, by means of applying force on the handle, the handle is driven to rotate, so that the sliding part pushes the elastic part to enable the elastic part in a compressed state, thereby enable the sliding part to detach from the groove, so as to control the maximum thrust.

8. The removal device according to claim 7, wherein:
the sliding part is a sliding block;
the wrench part and the daughter-board panel are rotatably connected by using a first rotation shaft; the wrench part and the handle part are rotatably connected by using a second rotation shaft; and
in the initial state, the sliding block abuts against a groove bottom of the groove.

9. The removal device according to claim 7, wherein:
the sliding part is a bead;
the wrench part and the daughter-board panel are rotatably connected by using a first rotation shaft;
the wrench part and the handle part are rotatably connected by using a second rotation shaft;
in the initial state, the bead abuts against a groove bottom of the groove; and
a concave surface that matches the bead is provided on the groove bottom of the groove.

10. The removal device according to claim 7, wherein:
the sliding part is a sliding block;
a key is arranged on one end of the sliding block;
the wrench part and the daughter-board panel are rotatably connected by using a first rotation shaft;
the wrench part and the handle part are rotatably connected by using a second rotation shaft;
a key groove is provided on the second rotation shaft;
the key groove and the key are matched; and
in the initial state, the key of the sliding block abuts against the key groove of the second rotation shaft.

11. The removal device according to claim 1, wherein the removal device further comprises an adjustment apparatus, wherein the adjustment apparatus is connected to the thrust control apparatus and is configured to adjust thrust of the thrust control apparatus.

12. The removal device according to claim 11, wherein the adjustment apparatus is a screw.

* * * * *